United States Patent
Zou et al.

(10) Patent No.: US 11,121,267 B2
(45) Date of Patent: Sep. 14, 2021

(54) ANTIREFLECTIVE COATING FOR GLASS APPLICATIONS AND METHOD OF FORMING SAME

(71) Applicant: BOARD OF TRUSTEES OF THE UNIVERSITY OF ARKANSAS, Little Rock, AR (US)

(72) Inventors: Min Zou, Fayetteville, AR (US); Corey Thompson, Springdale, AR (US); Robert A. Fleming, Fayetteville, AR (US)

(73) Assignee: BOARD OF TRUSTEES OF THE UNIVERSITY OF ARKANSAS, Little Rock, AR (US)

( * ) Notice: Subject to any disclaimer, the term of this patent is extended or adjusted under 35 U.S.C. 154(b) by 443 days.

(21) Appl. No.: 14/771,451

(22) PCT Filed: Mar. 3, 2014

(86) PCT No.: PCT/US2014/019806
§ 371 (c)(1),
(2) Date: Aug. 28, 2015

(87) PCT Pub. No.: WO2014/134594
PCT Pub. Date: Sep. 4, 2014

(65) Prior Publication Data
US 2016/0005886 A1   Jan. 7, 2016

Related U.S. Application Data
(60) Provisional application No. 61/771,191, filed on Mar. 1, 2013.

(51) Int. Cl.
*H01L 31/0216* (2014.01)
*G02B 1/118* (2015.01)
(Continued)

(52) U.S. Cl.
CPC ...... *H01L 31/02168* (2013.01); *C03C 17/001* (2013.01); *C03C 17/32* (2013.01);
(Continued)

(58) Field of Classification Search
CPC .. H01L 31/02168; C03C 17/001; C03C 17/32
See application file for complete search history.

(56) References Cited

U.S. PATENT DOCUMENTS 5,858,526 A * 1/1999 Floch .................. C08K 3/22
                                                            428/327
7,842,352 B2   11/2010 Gemici et al.
(Continued)

FOREIGN PATENT DOCUMENTS

CN   102311234 A   1/2012
TW   201219506 A   5/2012
(Continued)

OTHER PUBLICATIONS

Hoogenboom et al., Solubility and Thermoresponsiveness of PMMA in Alcohol-Water Solvent Mixtures, Aust. J. Chem. 2010,63., 1173-1178.*
(Continued)

*Primary Examiner* — James M Mellott
(74) *Attorney, Agent, or Firm* — Locke Lord LLP; Tim Tingkang Xia, Esq.

(57) ABSTRACT

One aspect of the disclosure is directed to a method for forming an antireflective coating on a substrate, which includes providing a polymer solution and a silica solution, depositing the polymer solution on a surface of the substrate to forming a polymer film thereon, depositing the silica solution on the formed polymer film on the substrate to form a silica film thereon, thereby forming a stack structure having the silica film formed on the polymer film that is, in turn, formed on the substrate, and drying the stack structure
(Continued)

to form the antireflective coating on the substrate, wherein the antireflective coating comprises silica nanoparticles.

21 Claims, 12 Drawing Sheets

(51) Int. Cl.
    *C03C 17/42*     (2006.01)
    *C03C 17/00*     (2006.01)
    *C03C 17/32*     (2006.01)

(52) U.S. Cl.
    CPC .............. *C03C 17/42* (2013.01); *G02B 1/118* (2013.01); *C03C 2217/734* (2013.01)

(56) References Cited

U.S. PATENT DOCUMENTS

| | | | |
|---|---|---|---|
| 9,188,708 B2* | 11/2015 | Takane | C09D 7/67 |
| 2002/0103142 A1* | 8/2002 | Rolland | A61K 9/0019 |
| | | | 514/44 R |
| 2002/0150683 A1* | 10/2002 | Troian | B01F 13/0071 |
| | | | 137/828 |
| 2005/0239932 A1 | 10/2005 | Akiyama et al. | |
| 2006/0074172 A1 | 4/2006 | Yang et al. | |
| 2008/0185041 A1 | 8/2008 | Sharma et al. | |
| 2010/0221513 A1 | 9/2010 | Anderson et al. | |
| 2010/0313950 A1 | 12/2010 | Mukhopadhyay et al. | |
| 2011/0073003 A1 | 3/2011 | Gemici et al. | |
| 2012/0037025 A1* | 2/2012 | Patel | B32B 27/08 |
| | | | 101/483 |
| 2012/0114518 A1* | 5/2012 | Hara | C22C 1/1094 |
| | | | 419/66 |
| 2012/0176681 A1* | 7/2012 | Chang | B01F 5/0256 |
| | | | 359/614 |

FOREIGN PATENT DOCUMENTS

| | | |
|---|---|---|
| TW | 201219508 A | 5/2012 |
| WO | 2010005642 A2 | 1/2010 |
| WO | 2011116099 A1 | 9/2011 |
| WO | 2012044522 A1 | 4/2012 |
| WO | 2012047422 A1 | 4/2012 |
| WO | 2012087663 A1 | 6/2012 |
| WO | 2012151097 A1 | 11/2012 |

OTHER PUBLICATIONS

Nakajima, Akira et al., Transparent Superhydrophobic Thin Films with Self-Cleaning Properties, American Chemical Society, Langmuir, vol. 16:17, p. 7044-7047, Published on Web: Jul. 25, 2000.
Bravo, Javier et al., Transparent Superhydrophobic Films Based on Silica Nanoparticles, American Chemical Society, Langmuir, vol. 23:13, p. 7293-7298, Published on Web: May 25, 2007.
Son, Jaesung et al., A practical superhydrophilic self cleaning and antireflective surface for outdoor photovoltaic applications, Solar Energy Materials & Solar Cells, Elsevier, vol. 98, p. 46-51, Available online: Oct. 29, 2011.
Wu, Xufeng et al., Fabrication of a lotus-like micro-nanoscale binary structured surface and wettability modulation from superhydrophilic to superhydrophobic, Nanotechnology, Institute of Physics Publishing, vol. 16, p. 2056-2060, Published: Aug. 9, 2005.
Patankar, Neelesh A., Mimicking the Lotus Effect: Influence of Double Roughness Structures and Slender Pillars, American Chemical Society, Langmuir, vol. 20:19, p. 8209-8213, Published on Web: Aug. 6, 2004.
Lin, Yan-Hong et al., Fabrication and characterization of transparent superhydrophilic/superhydrophobic silica nanoparticulate thin films, Thin Solid Films, Elsevier, vol. 519, p. 5450-5455, Available online: Mar. 2, 2011.

Liu, Zhaoyue, Sol-gel SiO2/TiO2 bilayer films with self-cleaning and antireflection properties, Solar Energy Materials & Solar Cells, Elsevier, vol. 92, p. 1434-1438, Available online: Jul. 17, 2008.
Kesmez, Omer et al., Sol-gel preparation and characterization of anti-reflective and self-cleaning SiO2—TiO2 double-layer nanometric films, Solar Energy Materials & Solar Cells, Elsevier, vol. 93, p. 1833-1839, Available online: Jul. 18, 2009.
Prado, Raquel et al., Development of multifunctional sol-gel coatings: Anti-reflection coatings with enhanced self-cleaning capacity, Solar Energy Materials & Solar Cells, Elsevier, vol. 94, p. 1081-1088, Available online: Mar. 16, 2010.
Zhang, Xintong et al., Double-Layered TiO2—SiO2 Nanostructured Films with Self-Cleaning and Antireflective Properties, American Chemical Society, J. Phys. Chem B, vol. 110:50, p. 25142-25148, Published on Web: Oct. 26, 2006.
Lu, Xiaoying et al., Antifogging and antireflective silica film and its application on solar modules, Surface & Coatings Technology, Elsevier, vol. 206, p. 1490-1494, Available online: Sep. 21, 2011.
Ganjoo, S. et al., Persistent superhydrophilicity of sol-gel derived nanoporous silica thin films, IOP Publishing, J. Phys. D: Applied Physics, vol. 42:025302, p. 1-7, Published Dec. 18, 2008.
Du, Xin et al., Facile Fabrication of Hollow Mesoporous Silica Nanospheres for Superhydrophilic and Visible/Near-IR Antireflection Coatings, Wiley, Chemistry A European Journal, vol. 17, p. 8165-8174, 2011.
Cebeci, Fevzi et al., Nanoporosity-Driven Superhydrophilicity: A Means to Create Multifunctional Antifogging Coatings, American Chemical Society, Langmuir, vol. 22:6, p. 2856-2862, Published on Web: Feb. 10, 2006.
Shimizu, Wataru et al., Microporous Silica Thin Films with Low Refractive Indices and High Young's Modulus, American Chemical Society, Applied Materials & Interfaces, vol. 2:11, p. 3128-3133, Published on Web: Oct. 27, 2010.
Hiller, Jeri' Ann et al., Reversibly erasable nanoporous anti-reflection coatings from polyelectrolyte multilayers, Nature Materials, vol. 1, p. 59-63, Published online: Sep. 2, 2002.
Ferreira, Tiago et al., ImageJ User Guide Revised edition, ImageJ/Fiji 1.46r, p. 1-198, Oct. 2, 2012.
Tiwari, Santosh K. et al., Fabrication of Transparent Silica Thin Film by Room Temperature Deposition From a Sol, Transactions of the North American Manufacturing Research Institution of SME, vol. 35, p. 225-229, 2007.
Bhushan, Bharat et al., Self-Cleaning Efficiency of Artificial Superhydrophobic Surfaces, American Chemical Society, Langmuir, vol. 25:5, p. 3240-3248, Published on Web: Feb. 10, 2009.
Prevo, Brian G. et al., Convective Assembly of Antireflective Silica Coatings with Controlled Thickness and Refractive Index, American Chemical Society, Chem. Mater., vol. 17:14, p. 3642-3651, Published on Web: Jun. 4, 2005.
Lin, Shu-Hsuan et al., Design and fabrication of antireflective nanoparticle thin films with superhydrophilic self-cleaning properties on glass substrate, Elsevier, Journal of the Taiwan Institute of Chemical Engineers, vol. 42, p. 852-859, Available online: May 10, 2011.
Li, Xiaoyu et al., Superhydrophilic coatings with enhanced transmittance fabricated from solid and mesoporous silica nanoparticles, Taylor & Francis Group, Journal of Adhesion Science and Technology, vol. 28: 8-9, p. 815-822, 2014.
Camurlu, Hasan Erdem et al., Sol-gel thin films with anti-reflective and self-cleaning properties, Chemical Papers, vol. 66:5, p. 461-471, 2012.
Nimittrakoolchai, On-Uma et al., Fabrication of Silica Based Multilayer Films with Self-Cleaning and Antireflective Properties, American Scientific Publishers, Journal of Nanoscience and Nanotechnology, vol. 11:10, pp. 3880-8884, 2011.
Zhang, Jilin et al., Fabrication and use of artificial superhydrophilic surfaces, Taylor & Francis Group, Journal of Adhesion Science and Technology, vol. 28:8-9, p. 751-768, 2014.
Korean Intellectual Property Office (ISR/KR), "International Search Report for PCT/US2014/019806", Korea, Jul. 1, 2014.

\* cited by examiner

| 120 nm SiO2 (n=1.23) | 200 nm PVP (n=1.48) | 1 mm Glass (n=1.5) | 200 nm PVP (n=1.48) | 120 nm SiO2 (n=1.23) |

FIG. 2

ANTIREFLECTIVE COATING FOR GLASS APPLICATIONS AND METHOD OF FORMING SAME

CROSS-REFERENCE TO RELATED PATENT APPLICATION

This application claims priority to and the benefit of, pursuant to 35 U.S.C. § 119(e), U.S. provisional patent application Ser. No. 61/771,191, filed Mar. 1, 2013, entitled "APPLICATIONS OF TRANSPARENT POLYMER," by Min Zou, Corey Thompson and Robert A. Fleming, which is incorporated herein in its entirety by reference.

Some references, which may include patents, patent applications and various publications, are cited and discussed in the description of this invention. The citation and/or discussion of such references is provided merely to clarify the description of the disclosure and is not an admission that any such reference is "prior art" to the disclosure described herein. All references cited and discussed in this specification are incorporated herein by reference in their entireties and to the same extent as if each reference was individually incorporated by reference. In terms of notation, hereinafter, "[n]" represents the nth reference cited in the reference list. For example, [5] represents the 5th reference cited in the reference list, namely, C. S. Thompson, R. A. Fleming, M. Zou, Transparent self-cleaning and antifogging silica nanoparticle films, Solar Energy Materials and Solar Cells 115 (2013) 108-113.

STATEMENT AS TO RIGHTS UNDER FEDERALLY-SPONSORED RESEARCH

This invention was made with government support under grant numbers CMS-0645040 and EPS-10003970, awarded by the National Science Foundation. The government has certain rights in the invention.

FIELD OF THE DISCLOSURE

The disclosure relates generally to applications of polymers, and more particularly to nanostructured antireflective coating, methods of forming the nanostructured antireflective coating, and applications of the nanostructured antireflective coating in glass devices including solar panels and photovoltaic devices.

BACKGROUND OF THE DISCLOSURE

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the disclosure.

The air-glass interface at the surface of a packaged solar panel can reflect a significant amount of the incident light, resulting in a significant drop in the power output of the panel. One method of reducing this loss is to utilize antireflective coatings. Single layer antireflective coatings (ARC) have been reported using porous silica films with an index of refraction of approximately n=1.23 [1]. However, the reflectance from these coatings can only be minimized at a single wavelength. In order to reduce these losses, the optical reflectance must be minimized over a large range of wavelengths.

Recent developments in graded index, or "moth-eye" coatings promise wide-band antireflection characteristics. In these coatings, the percent area of solid material varies continuously from 0% at the interface with the incident medium to 100% at some depth in the coating due to surface topography [6-8]. The effective index of refraction at any depth in the coating can be calculated using an effective medium approximation. This behavior mimics the wide-band antireflective behavior of moths eyes which are covered with cylindrical structures arranged in a hexagonal array with a diameter of around 240 nm [6]. Li et al. produced these structures on glass substrates using reactive ion etching with polystyrene beads as an etching mask and achieved transmittance of 98% from 300-800 nm [7]. Du et al. utilized a chemical treatment to induce graded index behavior at the surface of glass substrates resulting in transmittance of greater than 98%. However, the chemical process requires 13 hours of submersion in a caustic solution[8].

Silica nanoparticle films are widely used as antireflective coatings on solar cell cover glass [1-3] due to the porosity induced low index of refraction. However, the capability to deposit these films from aqueous solutions is one of challenges preventing application in industrial processes [4].

Therefore, a heretofore unaddressed need exists in the art to address the aforementioned deficiencies and inadequacies.

SUMMARY OF THE DISCLOSURE

Certain aspects of the disclosure are directed to nanostructured antireflective coating, methods for forming the nanostructured antireflective coating, and applications of the nanostructured antireflective coating in solar panels and photovoltaic devices.

In one aspect of the disclosure, a method for forming an antireflective coating on a substrate includes the steps of (a) providing a polyvinylpyrrolidone (PVP) solution and a silica solution; (b) depositing the PVP solution on a surface of the substrate to forming a PVP film thereon; and (c) depositing the silica solution on the formed PVP film on the substrate to form a silica film thereon, thereby forming a stack structure having the silica film formed on the PVP film that is, in turn, formed on the substrate.

In one embodiment, the PVP film dissolves in the silica solution of the silica film as the silica film is formed on the PVP film.

In one embodiment, the method further includes, prior to depositing the PVP solution, cleaning the substrate. In one embodiment, the cleaning step is performed by ultra-sonication.

In one embodiment, each of the depositing steps (a) and (b) is performed by a dip coating process.

In one embodiment, the method further includes drying the stack structure to form the antireflective coating on the substrate, where the antireflective coating comprises silica nanoparticles uniformly adhered on the surface of the substrate. In one embodiment, the drying step is performed at a temperature in a range of about 10-1200° C.

In one embodiment, the substrate is formed of glass.

In one embodiment, the PVP solution has a concentration of the PVP in a range of about 1-20 wt %.

In one embodiment, the PVP film has a thickness in a range of about 5-300 nm. In one embodiment, the silica film has a thickness in a range of about 5-300 nm.

In another aspect of the disclosure, a method for forming an antireflective coating on a substrate includes the steps of (a) providing a polymer solution and a silica solution having silica nanoparticles; (b) depositing the polymer solution on a surface of the substrate to forming a polymer film thereon; and (c) depositing the silica solution on the formed polymer film on the substrate to form a silica film thereon, thereby forming a stack structure having the silica film formed on the polymer film that is, in turn, formed on the substrate In one embodiment, the substrate is formed of a transparently dielectric material having a refractive index, $n_s$. In one embodiment, the polymer solution contains a transparent polymer having a refractive index, $n_p$, wherein the refractive index $n_p$ of the transparent polymer is between the refractive index of air and the refractive index $n_s$ of the dielectric material.

In one embodiment, the substrate is formed of glass. In one embodiment, the transparent polymer comprises polyvinylpyrrolidone (PVP), polyethylene, poly(methyl methacrylate) (PMMA), polystyrene, polypropylene, polysiloxanes, polyvinylalcohol, polyamide, Ethylene vinyl acetate (EVA), or a combination of them.

In one embodiment, the transparent polymer is soluble. In one embodiment, the polymer film dissolves in the silica solution of the silica film as the silica film is formed on the polymer film. In one embodiment, the silica nanoparticles are uniformly adhered on the surface of the substrate.

In one embodiment, the transparent polymer is insoluble. In one embodiment, the silica nanoparticles are uniformly adhered on the polymer film that is formed on the surface of the substrate.

In one embodiment, the polymer solution has a concentration of the transparent polymer in a range of about 1-20 wt %.

In one embodiment, the polymer film has a thickness in a range of about 5-300 nm. In one embodiment, the silica film has a thickness in a range of about 5-300 nm.

In one embodiment, the method further includes, prior to depositing the PVP solution, cleaning the substrate. In one embodiment, the cleaning step is performed by ultra-sonication.

In one embodiment, each of the depositing steps (a) and (b) is performed by a dip coating process.

In one embodiment, the method further includes drying the stack structure. In one embodiment, the drying step is performed at a temperature in a range of about 10-1200° C.

In yet another aspect of the disclosure, an antireflective coating is formed on a substrate according to the above disclosed method.

In a further aspect of the disclosure, a solar panel includes at least one antireflective coating, as disclosed above.

In yet a further aspect of the disclosure, a photovoltaic device includes at least one antireflective coating, as disclosed above.

These and other aspects of the disclosure will become apparent from the following description of the preferred embodiment taken in conjunction with the following drawings, although variations and modifications therein may be affected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment.

FIG. 2 shows schematically a thin film stack utilized to model reflectance and transmittance of PVP adhesion layer and silica nanoparticle coating according to one embodiment of the disclosure. This coating is applied on both sides of the glass substrate during dip coating.

DETAILED DESCRIPTION OF THE DISCLOSURE

Figure 1A:
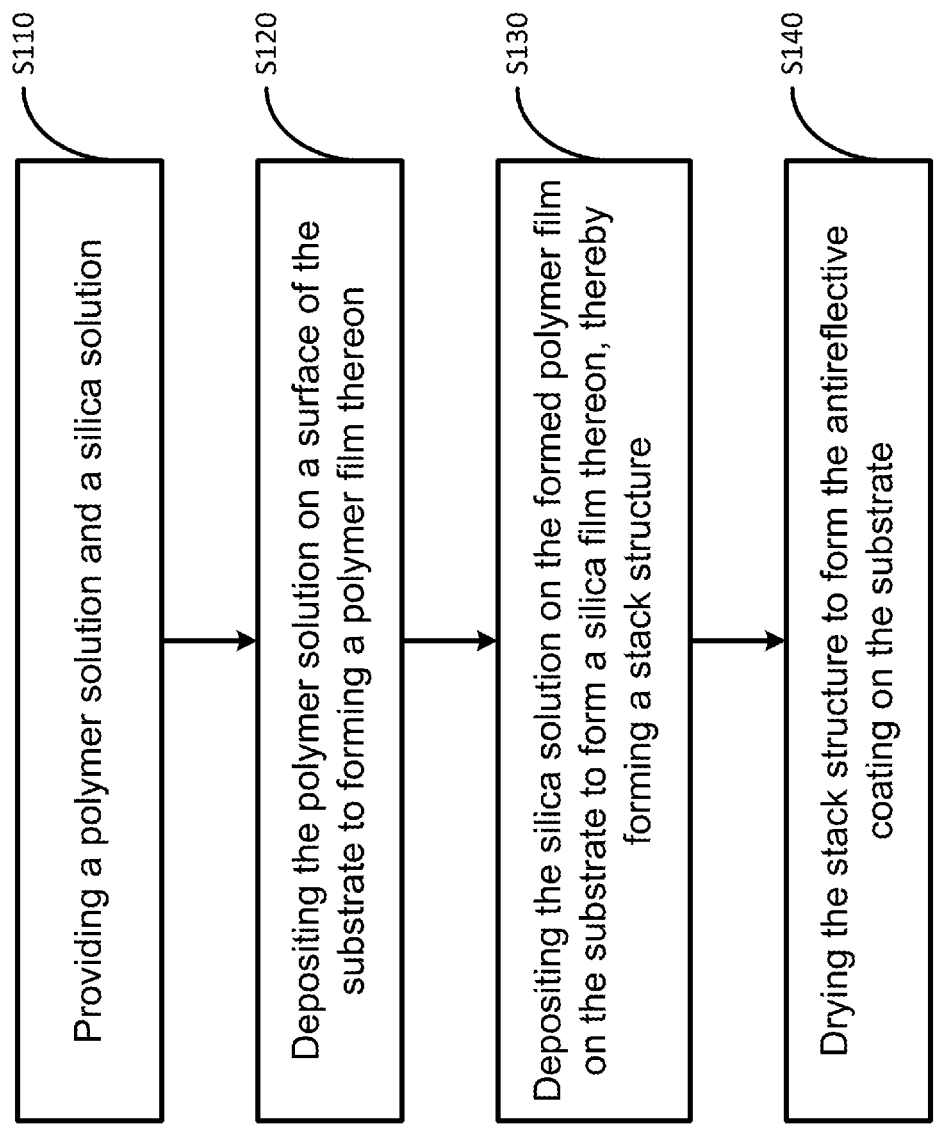
FIG. 1A shows a flowchart for forming an antireflective coating according to one embodiment of the disclosure.

The disclosure will now be described more fully hereinafter with reference to the accompanying drawings, in which exemplary embodiments of the disclosure are shown. This invention may, however, be embodied in many different forms and should not be construed as limited to the embodiments set forth herein. Rather, these embodiments are provided so that this disclosure will be thorough and complete, and will fully convey the scope of the disclosure to those skilled in the art. Like reference numerals refer to like elements throughout.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting and/or capital letters has no influence on the scope and meaning of a term; the scope and meaning of a term are the same, in the same context, whether or not it is highlighted and/or in capital letters. It will be appreciated that the same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification, including examples of any terms discussed herein, is illustrative only and in no way limits the scope and meaning of the disclosure or of any exemplified term. Likewise, the disclosure is not limited to various embodiments given in this specification.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below can be termed a second element, component, region, layer or section without departing from the teachings of the disclosure.

It will be understood that when an element is referred to as being "on", "attached" to, "connected" to, "coupled" with, "contacting", etc., another element, it can be directly on, attached to, connected to, coupled with or contacting the other element or intervening elements may also be present. In contrast, when an element is referred to as being, for example, "directly on", "directly attached" to, "directly connected" to, "directly coupled" with or "directly contacting" another element, there are no intervening elements present. It will also be appreciated by those of skill in the art that references to a structure or feature that is disposed "adjacent" to another feature may have portions that overlap or underlie the adjacent feature.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top", may be used herein to describe one element's relationship to another element as illustrated in the figures. It will be understood that relative terms are intended to encompass different orientations of the device in addition to the orientation shown in the figures. For example, if the device in one of the figures is turned over, elements described as being on the "lower" side of other elements would then be oriented on the "upper" sides of the other elements. The exemplary term "lower" can, therefore, encompass both an orientation of lower and upper, depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

As used herein, "around", "about", "substantially" or "approximately" shall generally mean within 20 percent, preferably within 10 percent, and more preferably within 5 percent of a given value or range. Numerical quantities given herein are approximate, meaning that the terms "around", "about", "substantially" or "approximately" can be inferred if not expressly stated.

As used herein, the terms "comprise" or "comprising", "include" or "including", "carry" or "carrying", "has/have" or "having", "contain" or "containing", "involve" or "involving" and the like are to be understood to be open-ended, i.e., to mean including but not limited to.

As used herein, the phrase "at least one of A, B, and C" should be construed to mean a logical (A or B or C), using a non-exclusive logical OR. It should be understood that one or more steps within a method may be executed in different order (or concurrently) without altering the principles of the disclosure.

As used herein, the term, "nano-sized material", refers to an object of intermediate size between molecular and microscopic (micrometer-sized) materials. In describing nano-sized materials, the sizes of the nano-sized materials refer to the number of dimensions on the nanoscale. For example, nanotextured surfaces have one dimension on the nanoscale, i.e., only the thickness of the surface of an object is between 1.0 and 1000.0 nm. Nanowires have two dimensions on the nanoscale, i.e., the diameter of the tube is between 1.0 and 1000.0 nm; its length could be much greater. Finally, sphere-like nanoparticles have three dimensions on the nanoscale, i.e., the particle is between 1.0 and 1000.0 nm in each spatial dimension. A list of nano-sized materials includes, but are not limited to, nanoparticle, nanocomposite, quantum dot, nanofilm, nanoshell, nanofiber, nanowire, nanotree, nanobush, nanotube, nanoring, nanorod, and so on.

The description below is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. For purposes of clarity, the same reference numbers will be used in the drawings to identify similar elements. It should be understood that one or more steps within a method may be executed in different order (or concurrently) without altering the principles of the disclosure.

OVERVIEW

The cover glass used in solar cell packaging can reflect a significant amount of light, resulting in lower device efficiencies and decreased power output. In order to reduce the loss of the power output of the packaged solar cells (panel) due to reflectance at an air-glass interface of the panel, antireflective coatings are applied on the packaging (cover) glass.

Using the Fresnel equations, the ideal antireflective coating for a glass-air interface should have an index of refraction of n=1.23 [1]. The lowest index of refraction solid thin film coating available is $MgF_2$ with n=1.38. A lower index film is achievable using nanoparticle coatings due to the presence of porosity that lowers the bulk index of refraction [2]. This relationship is shown below:

$$n_p = \sqrt{(1-p)(n_d^2-1)+1},$$

where $n_p$ and $n_d$ are the indices of refraction for the porous and dense films, respectively, and p is the porosity fraction.

Silica nanoparticle films are widely used as antireflective coatings on a solar cell cover glass [1-3] due to the porosity induced low index of refraction. However, the capability to deposit these films from aqueous solutions is one of challenges preventing application in industrial processes [4].

According to the disclosure, the use of a transparent polymer as an adhesion layer can facilitate the deposition of a uniform silica nanoparticle antireflective film on a substrate. The transparent polymer acts as a surface modification to the substrate allowing increased wettability of the surface with aqueous coating solutions.

In certain embodiments, suitable polymers are selected based on the index of refraction being sufficiently close to the dielectric substrate to be coated and having sufficiently high optical transmittance. In certain embodiments, the substrate is formed of a transparently dielectric material having a refractive index, $n_s$. In certain embodiments, the suitable polymers are those having a refractive index, $n_p$, which is between the refractive index of air and the refractive index $n_s$ of the dielectric material. In certain embodiments, the refractive index $n_p$ of the transparent polymer is equal or substantially approximate to the refractive index $n_s$ of the dielectric material. In certain embodiments, these polymers would be compatible with solution processing methods. However, other methods can also be utilized to practice the invention.

In certain embodiments, the dielectric substrate is a glass substrate ($n_s$=1.5). Accordingly, the transparent polymers, such as polyvinylpyrrolidone (PVP), polyethylene, poly (methyl methacrylate) (PMMA), polystyrene, polypropylene, polysiloxanes, polyvinylalcohol, polyamide, ethylene vinyl acetate (EVA), or a combination of them, whose refractive indices, as listed in Table I, are equal or substantially approximate to the refractive index $n_s$=1.5 of the glass substrate, can be utilized as the adhesion layer.

TABLE I

| Polymers and its Index of Refraction | |
| --- | --- |
| Polymer | Refractive Index $n_p$ |
| Polyethylene | ~1.5 |
| PMMA | ~1.49 |

TABLE I-continued

| Polymers and its Index of Refraction | |
| --- | --- |
| Polymer | Refractive Index $n_p$ |
| Polystyrene | ~1.5 |
| Polypropylene | ~1.49 |
| Polysiloxanes | 1.4-1.54 |
| Polyvinylalcohol | ~1.5 |
| Polyamide | ~1.5 |
| EVA | ~1.47 |

FIG. 1A illustrates the process/method of forming an antireflective coating on a substrate, with the use of a transparent polymer as the adhesion layer, according to one embodiment of the disclosure. The process/method includes the following steps: at step S110, a polymer solution and a silica solution are provided. The polymer solution has a concentration of the transparent polymer in a range of about 1-20 wt %. The silica solution contains a colloidal silica solution.

At step S120, the polymer solution is deposited on a surface of the substrate to forming a polymer film thereon. In certain embodiments, the polymer film has a thickness in a range of about 5-300 nm.

At step S130, the silica solution is deposited on the formed polymer film on the substrate to form a silica film thereon, thereby forming a stack structure having the silica film formed on the polymer film that is, in turn, formed on the substrate. In certain embodiments, the silica film has a thickness in a range of about 5-300 nm.

In certain embodiments, each of the depositing steps S120 and S130 is performed by a dip coating, spray coating, or roll coating process, or any combination thereof.

In certain embodiments, prior to depositing the polymer solution, the substrate may need to be cleaned, which can be performed by ultra-sonication, or self-cleaning.

At step S140, the stack structure is dried to form the antireflective coating on the substrate, wherein the antireflective coating comprises silica nanoparticles. In certain embodiments, the drying step S140 is performed at a temperature in a range of about 10-1200°. For example, the drying step S140 can be performed by placing the stack structure in room temperature, or by heating the stack structure to the temperature in the range of about 10-1200°. In certain embodiments, the heating process can enhance the durability/strength of the film due to calcification.

Figure 1B:
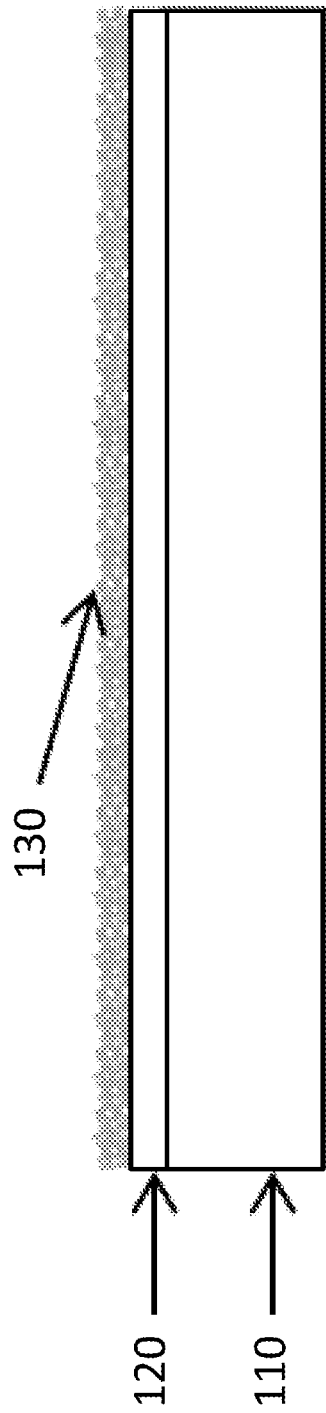
FIG. 1B shows schematically a cross-section view of an antireflective coating according to one embodiment of the disclosure.

In certain embodiments, the transparent polymer is insoluble. Accordingly, the silica nanoparticles 130 of the antireflective coating are uniformly adhered on the polymer film 120 that is formed on the surface of the substrate 110, as shown in FIG. 1B.

Figure 1C:
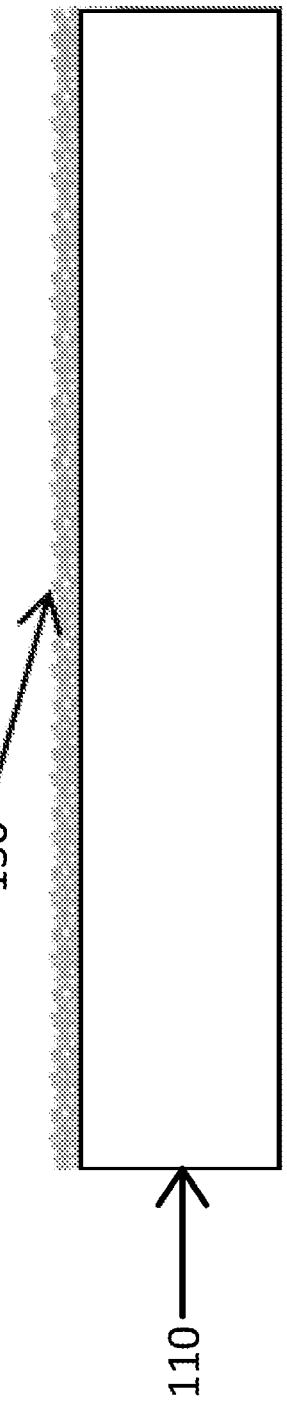
FIG. 1C shows schematically a cross-section view of an antireflective coating according to another embodiment of the disclosure.

In certain embodiments, the transparent polymer, e.g., PVP, is soluble. During the process, the polymer film may dissolve in the silica solution of the silica film as the silica film is formed on the polymer film. Accordingly, the silica nanoparticles 130 of the antireflective coating are uniformly adhered on the surface of the substrate 110, as shown in FIG. 1C.

The above disclosed process can be applied to solar cells (panels) and photovoltaic devices to form one or more nanostructured antireflective coating on the packaging substrates so as to reduce the loss of the power output of the packaged solar cells (panels) and the photovoltaic devices due to the reflectance at the air-substrate interfaces of the solar cells (panels) and the photovoltaic devices.

In certain embodiments, the polymer PVP is used as an adhesion layer for silica nanoparticle antireflective glass coatings. The PVP has an index of refraction close to soda lime glass and exhibits excellent film forming qualities, and is found to significantly increase the uniformity of the deposited silica nanoparticle film and results in an average transmittance of greater than about 98% in the wavelength range of about 450-1100 nm. Silica nanoparticle coatings deposited without the PVP layer resulted in an average transmittance of only about 95%. When the PVP/SiO$_2$ coated glass is used to package a crystalline silicon solar cell, the short circuit current is increased to about 36.97 mA/cm$^2$ from about 35.42 mA/cm$^2$ for the same cell packaged with a bare glass.

Among other things, the invention can find applications in a variety of fields, such as building glass, biological applications, solar devices, and the like.

Without intent to limit the scope of the disclosure, exemplary examples and their related results according to the embodiments of the disclosure are given below. Note that titles or subtitles may be used in the examples for convenience of a reader, which in no way should limit the scope of the disclosure. Moreover, certain theories are proposed and disclosed herein; however, in no way they, whether they are right or wrong, should limit the scope of the disclosure so long as the disclosure is practiced according to the disclosure without regard for any particular theory or scheme of action.

Example 1

Silica Nanoparticle Antireflective Coating with Pvp Adhesion Layer

According to the disclosure, in order to reduce the loss of the power output of a packaged solar panel due to reflectance at an air-glass interface of the panel, antireflective coatings are applied on the packaging (cover) glass.

In this exemplary example, a transparent polymer, such as PVP, is used as an adhesion layer for silica nanoparticle antireflective glass coatings. The adhesion layer of PVP is deposited prior to dip coating in an aqueous silica nanoparticle solution. Thin films of PVP have an index of refraction (n=1.48) that is very similar to glass (n=1.5) which reduces reflection at the glass-PVP interface. PVP is a water soluble polymer that has been used in literature to improve the wettability of aqueous coating solutions. PVP also bonds easily to both the glass substrate and the nanoparticle film. These characteristics improve both the uniformity and antireflective performance of silica nanoparticle coatings while maintaining compatibility with scalable deposition technologies based on solution processing. In this example, PVP was found to significantly increase the uniformity of the deposited silica nanoparticle film and results in an average transmittance of greater than 98% in the wavelength range of 450-1100 nm. Silica nanoparticle coatings deposited without the PVP layer resulted in an average transmittance of 95%. Further, when the PVP/SiO$_2$ coated glass was used to package a crystalline silicon solar cell, the short circuit current was increased to 36.97 mA/cm$^2$ from 35.42 mA/cm$^2$ for the same cell packaged with bare glass.

Sample Fabrication

In this example, PVP (40,000 MW, AMRESCO, USA) is used as an adhesion layer to facilitate the deposition of a uniform silica nanoparticle antireflective film on soda-lime glass microscope slides (No. 8201, Ted Pella, USA) following the procedure outlined in FIG. 1A. The optical properties of these substrates are then characterized, and the best performers are used to package a commercially available crystalline silicon solar cell for electrical characterization.

The glass substrates were cleaned by sonication in methanol for about 10 minutes to remove any surface contamination, and then dried by blowing with nitrogen. Samples to be coated with the polymer adhesion layer were then dip coated in a solution of about 1 wt % PVP in methanol at withdrawal rate of about 50 mm/min. This results in a PVP film thickness of about 200 nm. All samples were then dipped in a colloidal silica solution (SNOWTEX, Nissan Chemical, USA) that had been diluted to about 5 wt %. The withdrawal rate was varied from about 10 to 80 mm/min to deposit different thicknesses of SiO$_2$ nanoparticle layer on the surface. All samples were dried in an oven at about 120° C. for about 5 minutes to remove any remaining moisture from the film.

Results and Discussion

Modeling:

A commercial spectroscopy software package (FilMeasure, Filmetrics, Inc., USA) was utilized to model the transmittance spectrum of the samples as a function of the SiO$_2$ nanoparticle coating thickness. The samples were modeled as a double sided coating with PVP thickness of about 200 nm and SiO$_2$ thicknesses from about 100-180 nm. An exemplary thin film stack is shown in FIG. 2, where each side of the 1 mm thick glass substrate (n=1.5) is coated with a PVP layer (n=1.48) with a thickness of 200 nm, which in turn, is coated with a SiO$_2$ layer (1.23) with a thickness of 120 nm. Previous work by the inventors had developed optical properties databases for both the silica nanoparticle films and PVP thin films [5].

Figure 3:
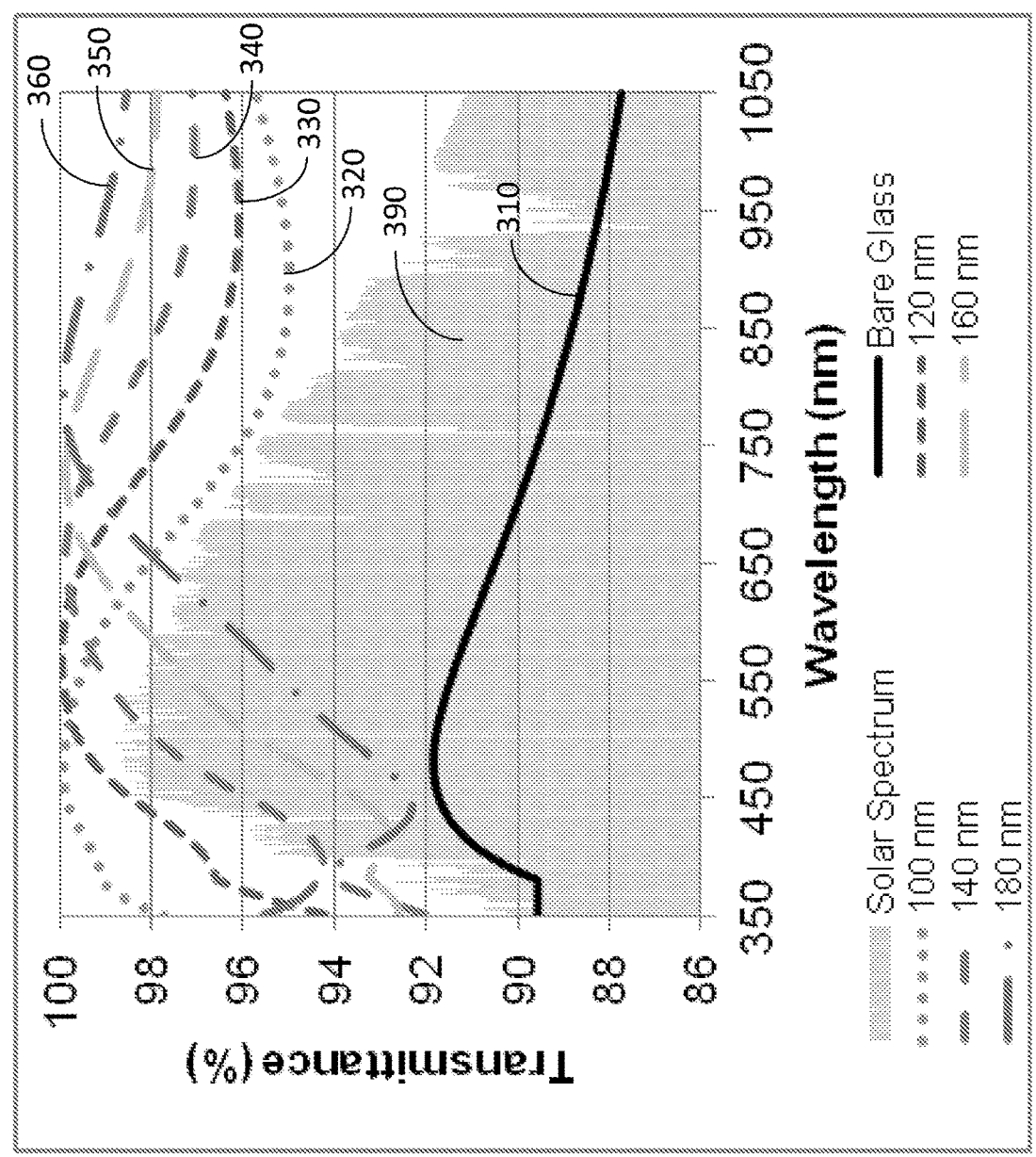
FIG. 3 shows modeled transmittances with various thicknesses of silica nanoparticle antireflective coating and 200 nm thick PVP adhesion layer according to one embodiment of the disclosure. The AM 1.5 solar spectrum is shown for reference.

The modeled transmittances (320, 330, 340, 350 and 360) with various thicknesses (100 nm, 120 nm, 140 nm, 160 nm and 180 nm) of the silica nanoparticle antireflective coating and a 200 nm thick PVP adhesion layer are shown in FIG. 3, where the AM 1.5 solar spectrum (390) is shown for reference. It can be determined from these data that the thickness of the SiO$_2$ nanoparticle coating has significant influence over the location of the maximum transmittance peak. All nanoparticle coating thicknesses improved the average transmittance from 450-1050 nm by more than 8%. When compared with the AM 1.5 solar spectrum, it is apparent that the SiO$_2$ coating with a thickness of about 120 nm provides the greatest increase in the transmitted solar energy.

Optical Characterization:

The transmittance of the coated samples was measured using a spectrophotometer (aRTie, Filmetrics, USA) with a measurement range of about 350-1050 nm. The average transmittance of various samples is shown in Table II. The use of PVP/SiO$_2$ coating increases the transmittance of glass by about 9.56%, far greater than the 5.45% increase seen with SiO$_2$ alone.

TABLE II

| Transmittance (Tavg) improvement | | | |
|---|---|---|---|
| PVP | SiO$_2$ thickness (nm) | $T_{avg}$ 450-1050 nm (%) | Improvement (%) |
| no | 0 | 90.04 | N/A |
| no | 150 | 94.94 | 5.44 |
| no | 190 | 94.95 | 5.45 |
| yes | 120 | 98.27 | 9.14 |
| yes | 130 | 98.65 | 9.56 |

Figure 4:
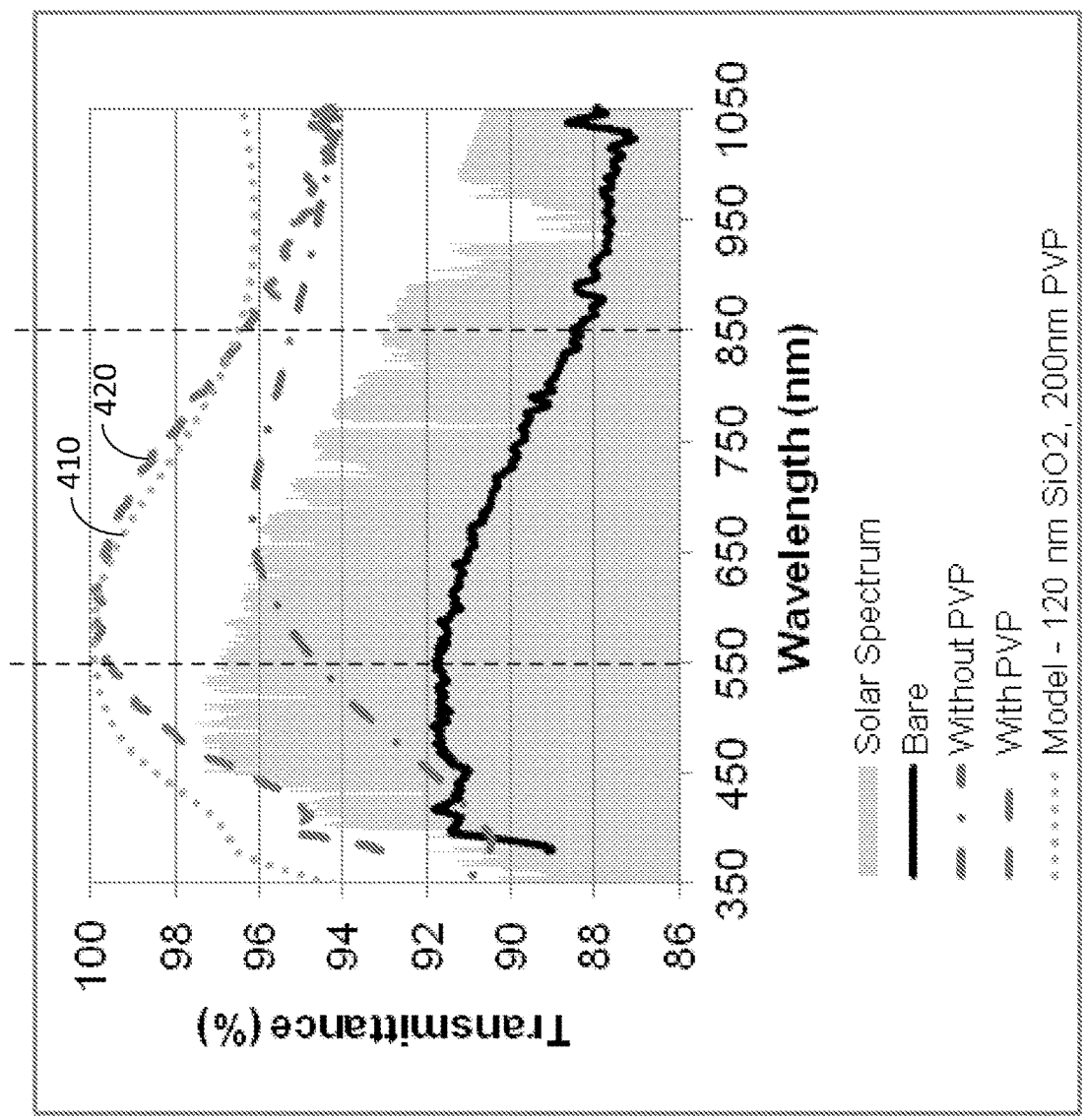
FIG. 4 shows optimized transmittances of silica nanoparticle coating with and without PVP adhesion layer according to one embodiment of the disclosure. The modeled transmittances are shown for reference.

The transmittance spectra of the samples with the highest transmittance both with and without the PVP adhesion layer are shown in FIG. 4. The model transmittance (410) for a 120 nm thick $SiO_2$ coating with a 200 nm thick PVP adhesion layer is shown to have very good agreement with the measured results (420) in wavelength range of 550-850 nm.

The film thicknesses were calculated using the reflectance spectra. The PVP thickness was confirmed to be about 200 nm, with the $SiO_2$ coating thickness varying between about 120 and about 190 nm depending on the dipping conditions. These values are shown in Table 1. The use of PVP as an adhesion layer resulted in thinner silica nanoparticle films that were significantly more uniform. The greatest transmittance improvement is realized for films with PVP adhesion layer and 130 nm silica nanoparticle films.

Electrical Characterization:

A test rig was designed that allows a small (2.5 cm$^2$) crystalline silicon solar cell (Model No. 276-124, RadioShack, USA) to be packaged with interchangeable glass covers. The sample was illuminated with a small-area class-B solar simulator (PV Measurements, Inc., USA) at AM 1.5 (100 mW/cm$^2$). The current-voltage characteristics were measured using a Keithley 2400 source meter.

Figure 5A:
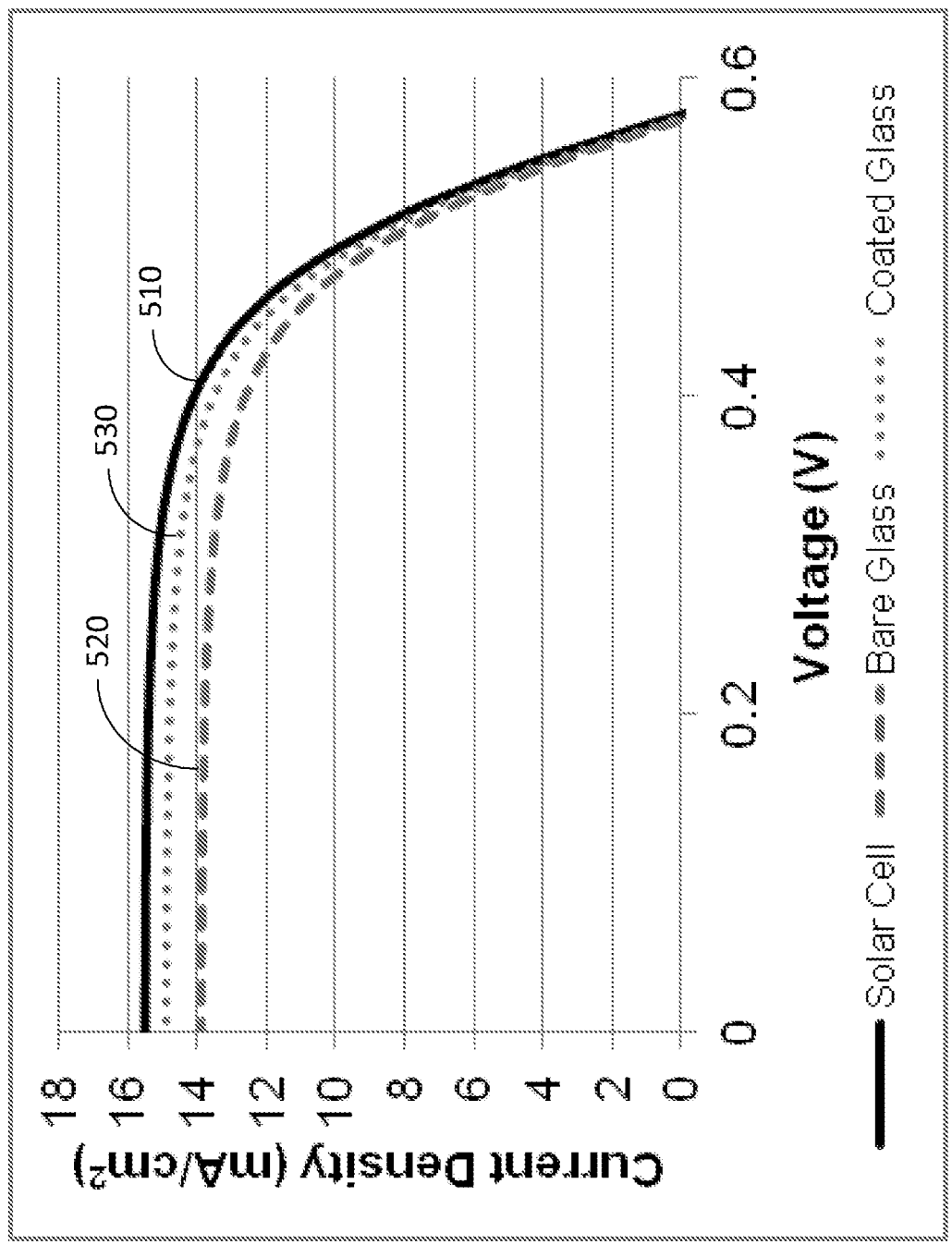
FIG. 5 shows current-voltage curves for crystalline silicon solar cells without a cover glass, packaged with a bare glass, and packaged with a glass coated with 200 nm PVP and 130 nm $SiO_2$ layers according to one embodiment of the disclosure.
Figure 5B:
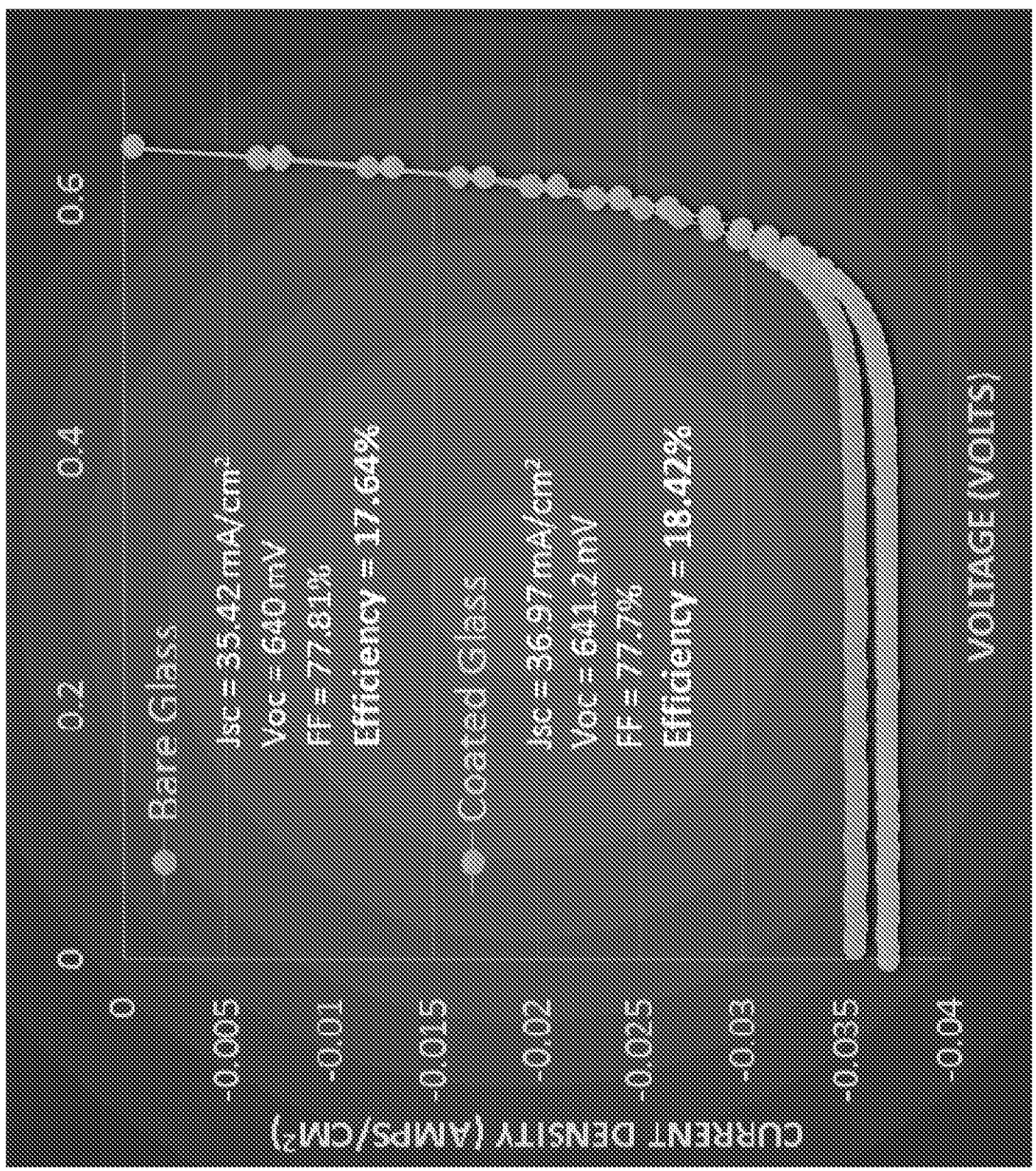

By packaging the solar cell with plain glass, both the short circuit current and efficiency of the packaged cell are reduced by more than 10%. When the cover glass is replaced with glass coated with 200 nm thick PVP and 130 nm thick $SiO_2$ layers, over 60% of those losses are recovered. The current voltage curves for a solar cell packaged with no cover (curve 510), bare glass (curve 520), and PVP/$SiO_2$ coated glass (curve 530) are shown in FIG. 5.

The open circuit voltage, short circuit current density, and efficiency measurements are shown in Table III. The use of glass coated with 200 nm thick PVP and 130 nm thick $SiO_2$ layers results in an increase in the short circuit current to 14.87 mA/cm$^2$ from 13.90 mA/cm$^2$ for bare glass. The overall efficiency of the selected solar cell is also increased to 5.47% from 5.13%.

TABLE III

Current-voltage characteristics

| Sample | $V_{oc}$ (V) | $J_{sc}$ (mA/cm$^2$) | Efficeiency (%) |
|---|---|---|---|
| Cell only | 0.574 | 15.48 | 5.71 |
| Bare Glass | 0.571 | 13.90 | 5.13 |
| PVP/$SiO_2$ | 0.573 | 14.87 | 5.47 |

SUMMARY

According to this exemplary example, the use of a transparent polymer adhesion layer significantly increases the effectiveness of a silica nanoparticle antireflective coating. The used polymer PVP has an index of refraction close to soda lime glass and exhibits excellent film forming qualities. By depositing a 200 nm thick PVP adhesion layer on the soda lime glass (substrate) prior to depositing a 130 nm thick silica nanoparticle coating, the transmittance of the regular soda lime glass is increased from about 90.04% to about 98.65%. The improved transmittance demonstrates that the coating is highly antireflective through the use of an aqueous silica nanoparticle solution. The improved optical properties lead to a higher short circuit current and efficiency of a crystalline silicon solar cell than when packaged with regular glass. In certain embodiments, over about 60% of the losses associated with packaging the cell with glass are recovered when packaged with PVP/$SiO_2$ coated glass.

Example 2

Nanostructured PVP/$SiO_2$ Antireflective Coating for Solar Panel Applications

Porous silica nanoparticle ARCs deposited by dip coating in aqueous solutions have been reported previously [5] and is a promising alternative to more expensive deposition processes. The water soluble polymer, PVP, has been used in literature to improve the wettability and uniformity of aqueous silica coating solutions [4]. PVP is transparent, and has an index of refraction of n=1.48, which is very close to that of the glass substrate (n=1.5). This limits reflection at the glass-PVP interface.

In this example, the water soluble polymer PVP is used as an adhesion layer in the deposition of silica nanoparticle films from aqueous solutions. A nanostructured antireflective coating is created using a simple aqueous dip coating method. The addition of PVP as an adhesion layer is shown to significantly impact the formation of nanostructures on the surface of the coating. Bearing analysis using atomic force microscopy (AFM) is utilized as a method of characterizing the surface topography that results in a graded index behavior. The resulting variation in surface roughness creates a layer with a graded index of refraction. These films create an antireflective surface that increases the optical transmittance of glass substrates from about 94.5% for silica nanoparticle films to about 98.6% for PVP enhanced silica nanoparticle films at about 500 nm wavelength.

Sample Fabrication

Silica nanoparticle films were fabricated on soda-lime glass substrates (No. 8201, Ted Pella, USA). The glass substrates were cleaned by ultra-sonication in methanol for about 10 minutes to remove surface contamination and then dried by blowing with nitrogen.

Samples to be coated with silica nanoparticle films are then dipped in a colloidal silica solution (SNOWTEX, Nissan Chemical, USA) that has been diluted to about 5 wt % by addition of deionized water. The withdrawal rates for these samples were optimized at about 80 mm/min in previous studies [5].

PVP enhanced films were deposited by first dip coating substrates at a rate of about 50 mm/min in a 5 wt % PVP (40,000 MW, AMRESCO, USA) in methanol solutions. The PVP coated substrates were then immediately dipped in about 5 wt % colloidal silica solution with a withdrawal rate of about 10 mm/min. This withdrawal rate has been chosen to maintain a constant total film thickness between the PVP enhanced silica films and the silica films without PVP.

All samples were dried at about 140° C. in an oven to remove residual water from the coating.

Results and Discussion

Figure 6:
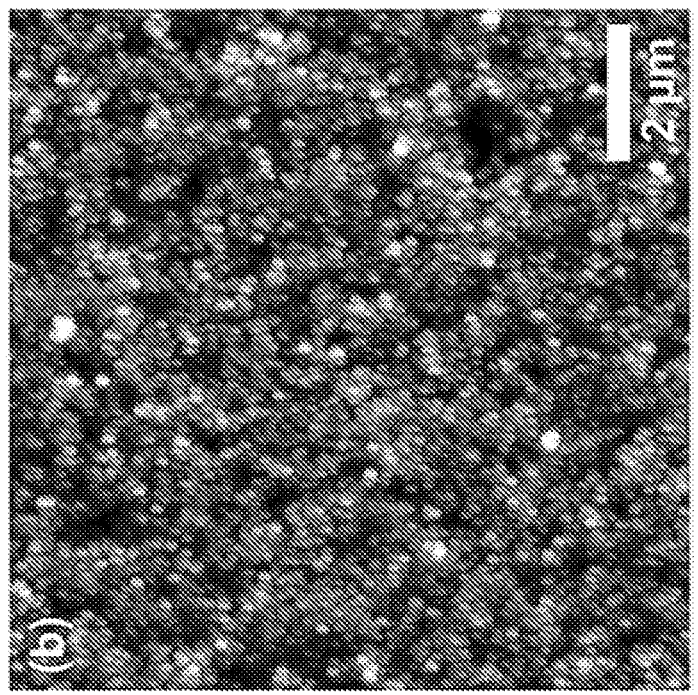
FIG. 6 shows AFM scans of (a) silica nanoparticle films and (b) PVP enhanced silica nanoparticle films on glass substrates according to one embodiment of the disclosure.
Figure 6:
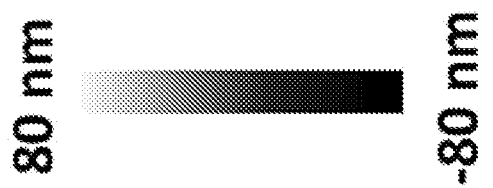
Figure 6:
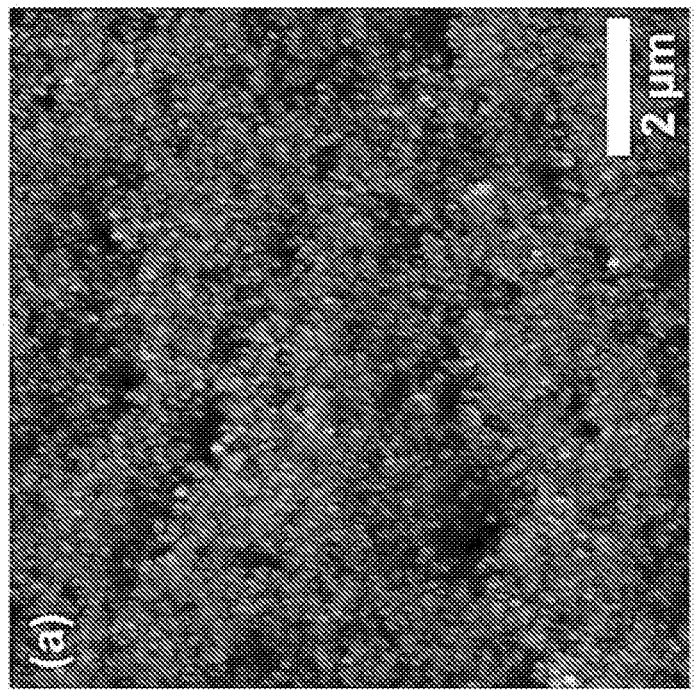

Atomic Force Microscopy (AFM):

AFM was used to characterize the surface topography of the coatings. The scans were taken in a tapping mode with a silicon probe (RTESPA, Bruker, USA) at a scan rate of about 1 Hz. The AFM characterization of the samples with and without PVP as an adhesion layer shows distinct differences in the topography of the surfaces, as shown in FIG. 6.

For silica nanoparticle films without PVP, the surface includes individual 50 nm particles visible in the AFM scan, as shown in FIG. 6(a). When PVP is used as an adhesion layer, the particles form agglomerates that are approximately 200 nm in diameter, as shown in FIG. 6(b). In addition, silica films without PVP are relatively smooth with large micron-sized pores, as shown in FIG. 6(a). With the addition of PVP, the surface roughness becomes more regular with a reduction in the occurrence of large pores, as shown in FIG. 6(b).

Figure 7:
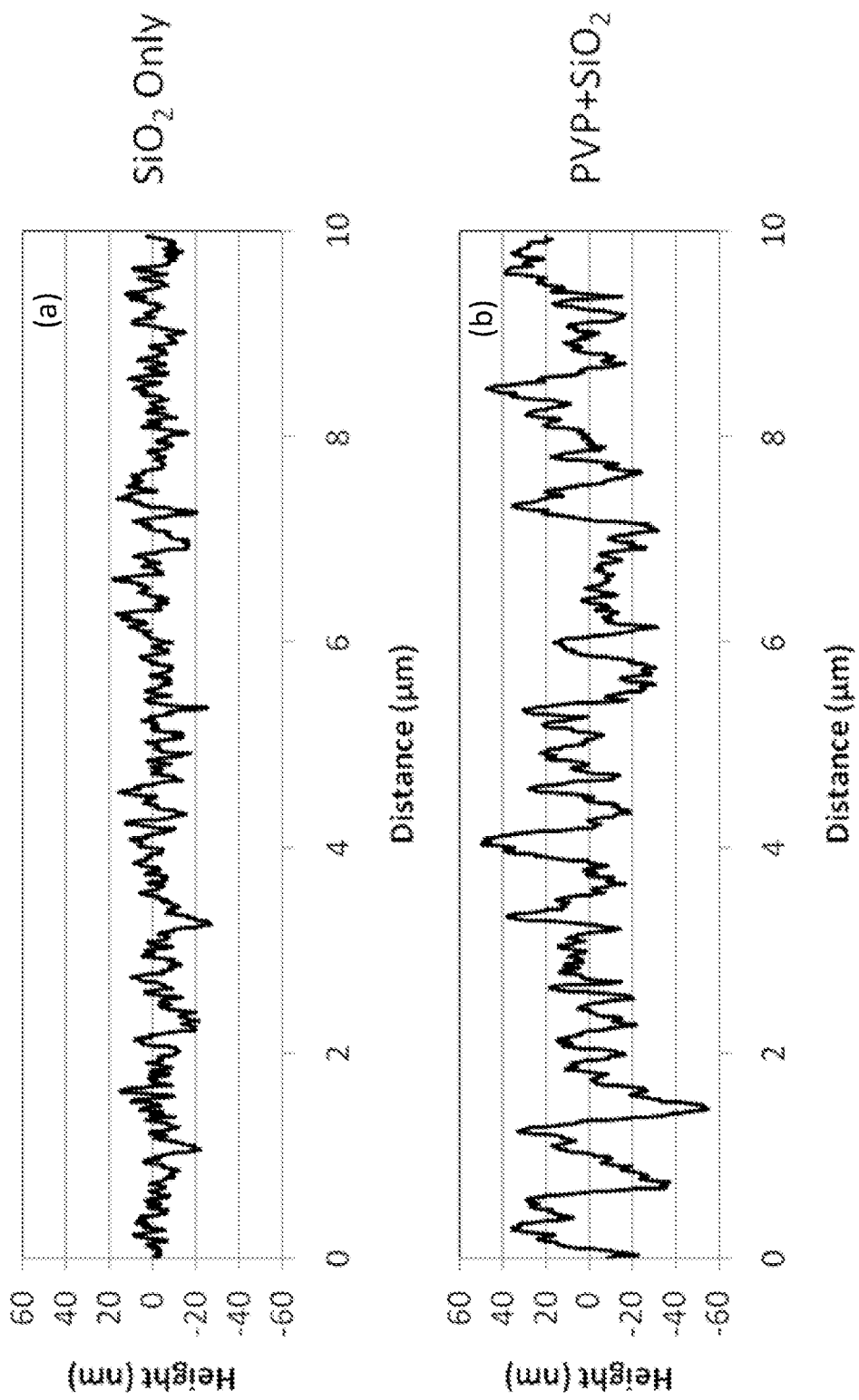
FIG. 7 shows cross sections of AFM scans for a silica film (a) and a PVP enhanced silica film (b) according to one embodiment of the disclosure.

Cross sections of these scans are shown in FIG. 7. It can be seen that the surface roughness of silica films without PVP is dominated by the particle size of approximately 50 nm with peak-to-valley distance close to 50 nm. However, for samples that have PVP adhesion layers, the peak-to-valley distance is close to 100 nm. The $R_a$ and $R_q$ values calculated for the entire AFM images are shown in Table IV.

TABLE IV

Roughness Parameters From AFM Scans

| Roughness Parameter | SiO$_2$ Only | PVP + SiO$_2$ |
|---|---|---|
| Ra | 9.1 nm | 15.6 nm |
| Rq | 11.7 nm | 20.3 nm |

Figure 8:
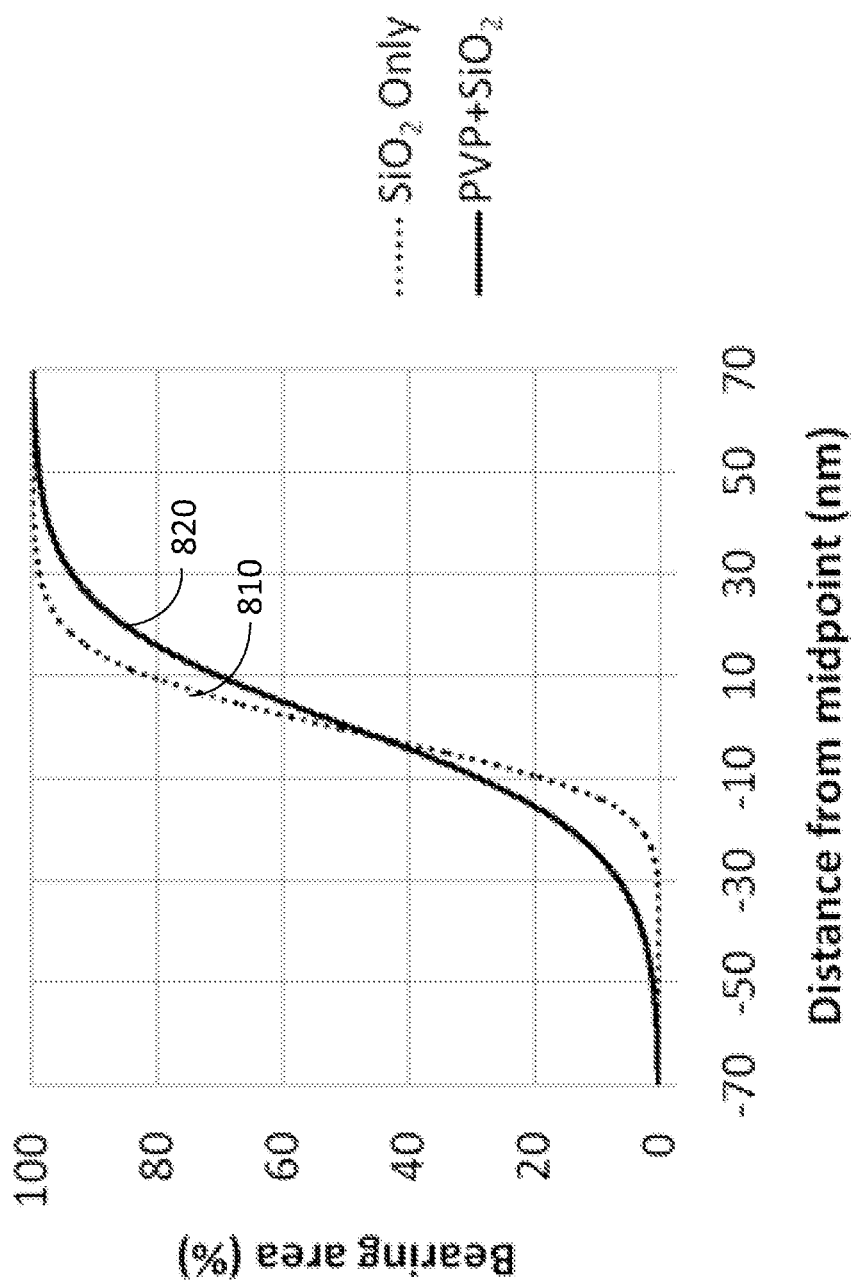
FIG. 8 shows bearing area curves for a silica nanoparticle film and a PVP enhanced silica nanoparticle film according to one embodiment of the disclosure.

Bearing Analysis:

Bearing analysis is an effective method to characterize nanoporosity of a sample surface. In the bearing analysis, the AFM image is analyzed to determine the percentage of area that is filled with material as a function of height. The outputs of the bearing analysis for samples with a PVP adhesion layer (curve 820) and without a PVP adhesion layer (curve 810) are shown in FIG. 8. The increased roughness and porosity of the surface of the PVP enhanced silica nanoparticle films results in a lower slope of the bearing curve (820) and a larger distance over which the bearing area changes. This effective distance for silica nanoparticle films is approximately 50 nm. For the PVP enhanced silica nanoparticle films, the effective distance is approximately 100 nm.

Based on the bearing analysis, the PVP enhanced silica films demonstrate better antireflective behavior than the silica films without PVP since the effective distance over which a continuously changing refractive index can be expected is approximately doubled.

Optical Characterization:

The optical transmittance and reflectance of the samples was characterized using a simultaneous reflectance and transmittance spectrophotometer (aRTie, Filmetrics, USA). The transmittance was measured over a wavelength range of about 350-1050 nm.

Figure 9:
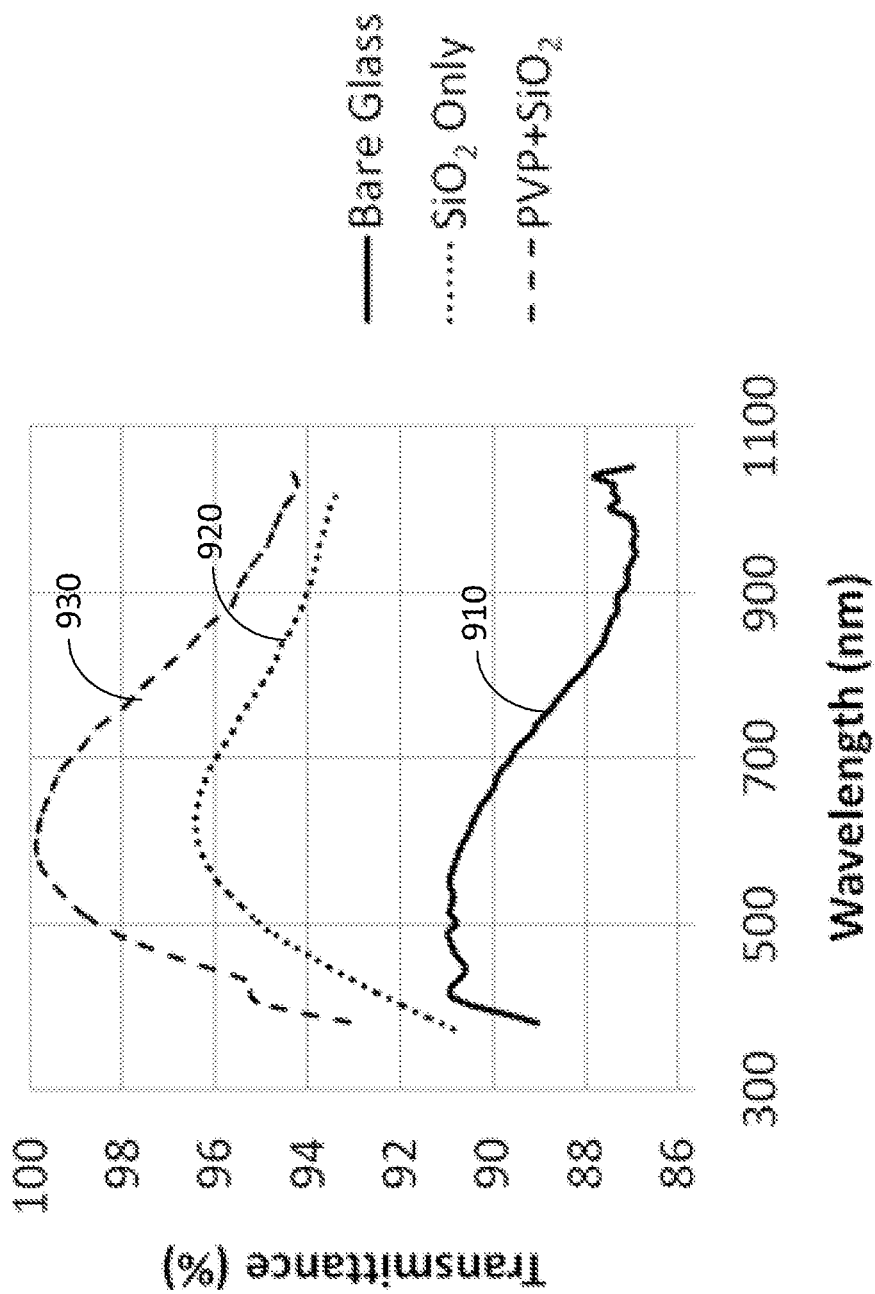
FIG. 9 shows optical transmittance spectra for a silica nanoparticle film and a PVP enhanced silica nanoparticle film according to one embodiment of the disclosure.

Optical transmittance spectra for silica nanoparticle and PVP enhanced silica nanoparticle films are shown in FIG. 9. The average transmittance over the range of interest for silicon based photovoltaic devices (550-1050 nm) is about 88.5% for bare glass (curve 910). The addition of a silica nanoparticle film increases the transmittance to about 95.0% (curve 920). The PVP enhanced silica films result in an additional increase in transmittance to about 97.2% (curve 930).

The significance of this increase is more apparent when the transmittance at a wavelength of about 500 nm, the peak wavelength of the solar spectrum, is considered. The PVP enhanced silica films increase the optical transmittance to about 98.6% at the wavelength of about 500 nm. The transmittance of the bare glass and silica coated glass at the wavelength of about 500 nm are about 90.7% and 94.5%, respectively.

Figure 10:
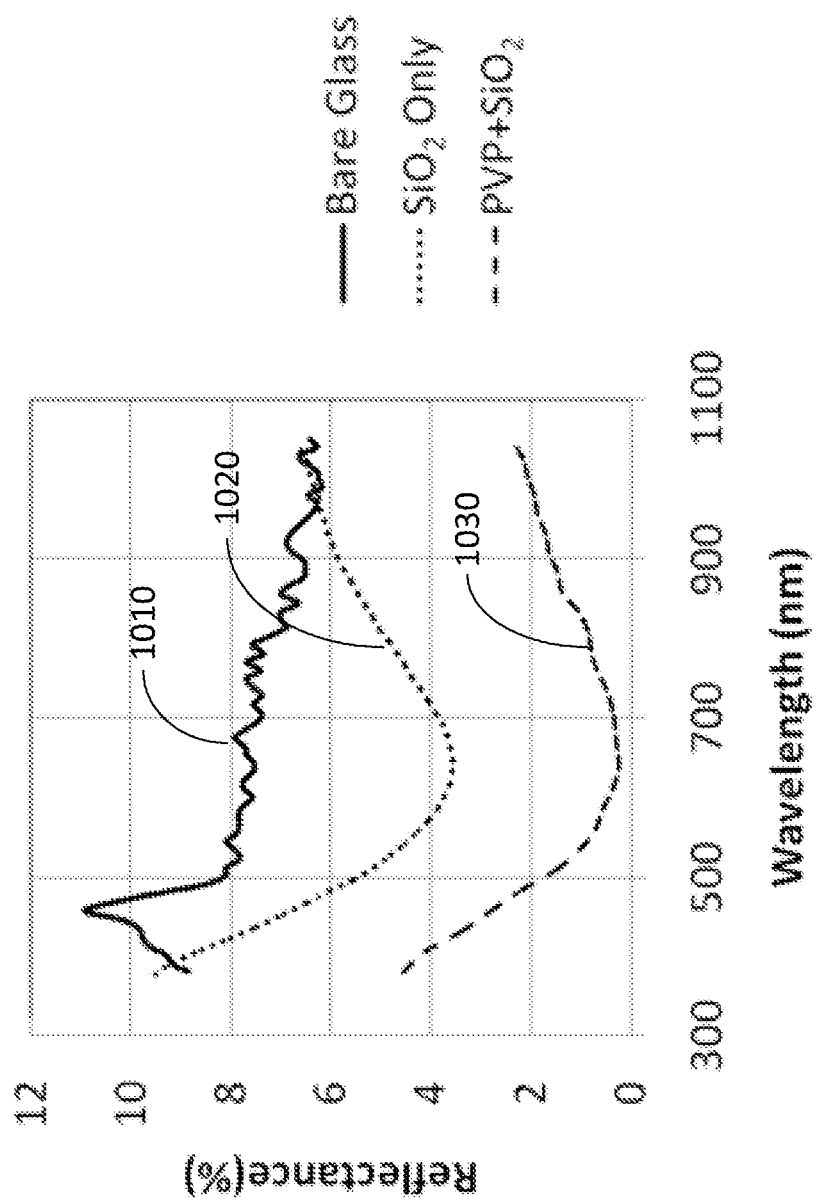
FIG. 10 shows reflectance spectra for a silica nanoparticle film and a PVP enhanced silica nanoparticle film according to one embodiment of the disclosure.

The average reflectance from 550-1050 nm for the bare glass is about 7.1% (curve 1010). The silica nanoparticle films reduce the reflectance in this range to about 4.96% (curve 1020). The addition of PVP as an adhesion layer further reduces the reflectance to an average of about 1.07% (curve 1030) from 550-1050 nm. The reflectance for the bare glass, the glass coated with silica nanoparticle film and the glass coated with PVP enhanced silica nanoparticle films, at 500 nm wavelength is about 7.85%, 5.44%, 0.83%, respectively. Due to the increased distance over which a graded index of refraction is present in the PVP enhanced silica films, the antireflective behavior is minimized over a larger range of wavelengths, as shown in FIG. 10.

SUMMARY

According to this exemplary example, the use of PVP as an adhesion layer during deposition of silica nanoparticle antireflective coatings directly impacts the surface topography and increases the optical transmittance. The PVP adhesion layer results in the agglomeration of nanoparticles and results in a higher surface roughness that increases the graded index antireflective effect. The graded index behavior of the silica nanoparticle coatings was related to the atomic force microscope topography measurements using bearing analysis. The PVP enhanced silica nanoparticle films on a soda-lime glass are found to transmit about 98.6% of incident light at the 500 nm wavelength, compared to only about 90.7% for the bare glass and about 94.5% for the silica nanoparticle coated glass. The increase in transmittance is the result of reflectance being reduced to about 0.83% for the PVP enhanced silica films at the 500 nm wavelength due to the increase in surface roughness.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the disclosure pertains without departing from its spirit and scope. Accordingly, the scope of the disclosure is defined by the appended claims rather than the foregoing description and the exemplary embodiments described therein.

REFERENCE LIST

[1] F. C. Cebeci, Z. Wu, L. Zhai, R. E. Cohen, M. F. Rubner, Nanoporosity-driven superhydrophilicity: A means to create multifunctional antifogging coatings, Langmuir 22 (2006) 2856-2862.

[2] W. Shimizu, Y. Murakami, Microporous silica thin films with low refractive indices and high young's modulus, ACS Appl. Mater. Interfaces 2 (2010) 3128-3133.

[3] X. Lu, Z. Wang, Z. Yang, X. Xu, L. Zhan, N. Zhao, et al., Antifogging and antireflective silica film and its application on solar modules, Surf. Coat. Technol. 206 (2011) 1490-1494.

[4] H. Kozuka, A. Yamano, M. Fujita, H. Uchiyama, Aqueous dip-coating route to dense and porous silica thin films using silica nanocolloids with an aid of polyvinylpyrrolidone, J. Sol-Gel Sci. Technol. 61 (2012) 381-389.

[5] C. S. Thompson, R. A. Fleming, M. Zou, Transparent self-cleaning and antifogging silica nanoparticle films, Solar Energy Materials and Solar Cells 115 (2013) 108-113.
[6] A. R. Parker, H. E. Townley, Biomimetics Of Photonic Nanostructures, Nature Nanotechnology 2, (2007) 347-353.
[7] Y. Li, J. Zhang, S. Zhu, H. Dong, F. Jia, Z. Wang, Z. Sun, L. Zhang, Y. Li, H. Li, W. Xu, B. Yang, Biomimetic Surfaces For High-Performance Optics, Advanced Materials 21 (2009) 4731-4734.
[8] Y. Du, H. He, Y. Jin, F. Kong, H. Guan, Z. Fan, Graded porous glasses for antireflective applications formed by chemical treatment, Applied Surface Science 258 (2012) 6431-6435.

What is claimed is:

1. A method for forming an antireflective coating on a substrate, comprising:
   (a) providing a polyvinylpyrrolidone (PVP) solution and a silica solution, wherein the PVP solution has a concentration of the PVP in a range of 1-20 wt %, and wherein the silica solution consists of a colloidal silica solution diluted by deionized water so that the silica solution comprises 5 wt % of silica in a colloidal form;
   (b) depositing the PVP solution directly on a surface of the substrate to form a PVP film in contact with the substrate; and
   (c) depositing the silica solution directly on the formed PVP film on the substrate to form a silica film in contact with the PVP film, thereby forming a stack structure having the silica film formed on the PVP film that is, in turn, formed on the substrate, wherein the PVP film is an adhesion promoting layer facilitating deposition of the silica film on the substrate,
   wherein the substrate is glass having a refractive index being 1.5, the PVP film has a refractive index being 1.48 and a thickness of 200 nm, and the silica film has a refractive index being 1.23 and a thickness of 120-300 nm, such that the stack structure has an average transmittance of greater than 98% in the wavelength range of 450-1050 nm.

2. The method of claim 1, wherein the PVP film dissolves in the silica solution of the silica film as the silica film is formed on the PVP film.

3. The method of claim 1, wherein each of the depositing steps (b) and (c) is performed by a dip coating, spray coating, or roll coating process, or any combination thereof.

4. The method of claim 1, further comprising drying the stack structure to form the antireflective coating on the substrate, wherein the antireflective coating comprises silica nanoparticles adhered on the surface of the substrate.

5. The method of claim 4, wherein the drying step is performed at a temperature in a range of 10-1200° C.

6. The method of claim 1, further comprising, prior to depositing the PVP solution, cleaning the substrate.

7. The method of claim 6, wherein the cleaning step is performed by ultra-sonication.

8. A method for forming an antireflective coating on a substrate, comprising:
   (a) providing a polymer solution and a silica solution containing silica nanoparticles, wherein the silica solution consists of a colloidal silica solution diluted by deionized water so that the silica solution comprises 5 wt % of silica in a colloidal form;
   (b) depositing the polymer solution directly on a surface of the substrate to form a polymer film in contact with the substrate; and
   (c) depositing the silica solution directly on the formed polymer film on the substrate to form a silica film in contact with the polymer film, thereby forming a stack structure having the silica film formed on the polymer film that is, in turn, formed on the substrate, wherein the polymer film is an adhesion promoting layer facilitating deposition of the silica film on the substrate,
   wherein the substrate is glass having a refractive index being 1.5;
   wherein the polymer solution contains a transparent polymer having a refractive index, $n_p$, wherein the refractive index $n_p$ of the transparent polymer is between the refractive index of air being 1 and a refractive index $n_s$ of the substrate being 1.5, and the polymer film has a refractive index being equal to, or less than the refractive index of the substrate being 1.5;
   wherein the transparent polymer is selected from the group consisting of polyethylene, polystyrene, polypropylene, polysiloxanes, polyamide, and a combination of them; and
   wherein the silica film has a refractive index being 1.23.

9. The method of claim 8, wherein the transparent polymer is soluble in the solvent of the silica solution.

10. The method of claim 9, wherein the polymer film dissolves in the silica solution of the silica film as the silica film is formed on the polymer film.

11. The method of claim 10, wherein the silica nanoparticles are adhered on the surface of the substrate.

12. The method of claim 8, wherein the transparent polymer is insoluble in the solvent of the silica solution.

13. The method of claim 12, wherein the silica film of silica nanoparticles is formed from the silica solution on the transparent polymer film that is formed on the surface of the substrate and the silica nanoparticles are uniformly adhered on the polymer film.

14. The method of claim 8, wherein the polymer solution has a concentration of the transparent polymer in a range of 1-20 wt %.

15. The method of claim 8, wherein the polymer film has a thickness in a range of 5-300 nm.

16. The method of claim 8, wherein the silica film has a thickness in a range of 5-300 nm.

17. The method of claim 8, wherein each of the depositing steps (b) and (c) is performed by a dip coating, spray coating, or roll coating process, or any combination thereof.

18. The method of claim 8, further comprising drying the stack structure.

19. The method of claim 18, wherein the drying step is performed at a temperature in a range of 10-1200° C.

20. The method of claim 8, further comprising, prior to depositing the polymer solution, cleaning the substrate.

21. The method of claim 20, wherein the cleaning step is performed by ultra-sonication.

* * * * *